(12) United States Patent
Brask et al.

(10) Patent No.: US 7,176,090 B2
(45) Date of Patent: Feb. 13, 2007

(54) METHOD FOR MAKING A SEMICONDUCTOR DEVICE THAT INCLUDES A METAL GATE ELECTRODE

(75) Inventors: Justin K. Brask, Portland, OR (US); Jack Kavalieros, Portland, OR (US); Mark L. Doczy, Beaverton, OR (US); Matthew V. Metz, Hillsboro, OR (US); Suman Datta, Beaverton, OR (US); Uday Shah, Portland, OR (US); Brian S. Doyle, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/936,114

(22) Filed: Sep. 7, 2004

(65) Prior Publication Data
US 2006/0051957 A1   Mar. 9, 2006

(51) Int. Cl.
*H01L 21/336* (2006.01)

(52) U.S. Cl. ............ 438/270; 438/275; 438/588; 438/638; 438/926; 438/199; 257/E27.06; 257/E29.126; 257/E27.108

(58) Field of Classification Search ........ 438/199, 438/270, 275, 585, 638, 926, FOR. 187, 438/FOR. 216, FOR. 238, 201, 294, 588; 257/E27.06, E27.108, E29.126
See application file for complete search history.

(56) References Cited

U.S. PATENT DOCUMENTS

| | | | |
|---|---|---|---|
| 6,063,698 A | 5/2000 | Tseng et al. | 438/585 |
| 6,184,072 B1 | 2/2001 | Kaushik et al. | 438/197 |
| 6,255,698 B1 | 7/2001 | Gardner et al. | 257/369 |
| 6,365,450 B1 | 4/2002 | Kim | 438/216 |
| 6,410,376 B1 | 6/2002 | Ng et al. | 438/199 |
| 6,420,279 B1 | 7/2002 | Ono et al. | 438/785 |
| 6,475,841 B1 | 11/2002 | Taylor, Jr. et al. | |
| 6,475,874 B2 | 11/2002 | Xiang et al. | 438/396 |
| 6,514,828 B2 | 2/2003 | Ahn et al. | 438/240 |
| 6,531,750 B2 * | 3/2003 | Chan et al. | 257/394 |
| 6,544,873 B1 | 4/2003 | Yeom et al. | |
| 6,544,906 B2 | 4/2003 | Rotondaro et al. | 438/785 |
| 6,551,913 B1 | 4/2003 | Kim et al. | |
| 6,586,288 B2 | 7/2003 | Kim et al. | 438/183 |

(Continued)

FOREIGN PATENT DOCUMENTS

EP   0 899 784 AZ   3/1999

(Continued)

OTHER PUBLICATIONS

PCT International Search Report; Application No. PCT/US2005/031499; Filing Date: Feb. 9, 2005.

(Continued)

*Primary Examiner*—Michelle Estrada
(74) *Attorney, Agent, or Firm*—Rahul D. Engineer

(57) ABSTRACT

A method for making a semiconductor device is described. That method comprises forming on a substrate a dielectric layer and a sacrificial structure that comprises a first layer and a second layer, such that the second layer is formed on the first layer and is wider than the first layer. After the sacrificial structure is removed to generate a trench, a metal gate electrode is formed within the trench.

20 Claims, 3 Drawing Sheets

U.S. PATENT DOCUMENTS

| | | | |
|---|---|---|---|
| 6,617,209 B1 | 9/2003 | Chau et al. | 438/240 |
| 6,617,210 B1 | 9/2003 | Chau et al. | 438/240 |
| 6,617,212 B2* | 9/2003 | Cho et al. | 438/270 |
| 6,620,713 B2 | 9/2003 | Arghavani et al. | 438/585 |
| 6,642,131 B2 | 11/2003 | Harada | 438/591 |
| 6,667,246 B2 | 12/2003 | Mitsuhashi et al. | 438/756 |
| 6,689,675 B1 | 2/2004 | Parker et al. | 438/585 |
| 6,696,327 B1 | 2/2004 | Brask et al. | 438/197 |
| 6,696,345 B2 | 2/2004 | Chau et al. | 438/387 |
| 6,709,911 B1 | 3/2004 | Doczy et al. | 438/197 |
| 6,716,707 B1 | 4/2004 | Brask et al. | 438/287 |
| 6,746,967 B2 | 6/2004 | Brask et al. | 438/752 |
| 6,770,568 B2 | 8/2004 | Brask | 438/746 |
| 6,855,605 B2* | 2/2005 | Jurczak et al. | 438/275 |
| 2001/0023120 A1* | 9/2001 | Tsunashima et al. | 438/585 |
| 2002/0000623 A1* | 1/2002 | Cho et al. | 257/388 |
| 2002/0058374 A1 | 5/2002 | Kim et al. | 438/228 |
| 2002/0086504 A1 | 7/2002 | Park et al. | 438/580 |
| 2002/0155665 A1 | 10/2002 | Doris et al. | |
| 2002/0187610 A1 | 12/2002 | Furukawa et al. | |
| 2002/0197790 A1 | 12/2002 | Kizilyalli et al. | 438/240 |
| 2003/0032303 A1 | 2/2003 | Yu et el. | 438/770 |
| 2003/0045080 A1 | 3/2003 | Visokay et al. | 438/591 |
| 2003/0143809 A1* | 7/2003 | Hummler | 438/270 |
| 2003/0211684 A1 | 11/2003 | Guo | |
| 2003/0228744 A1* | 12/2003 | Kohno et al. | 438/585 |
| 2003/0235942 A1 | 12/2003 | Nakamura et al. | |
| 2003/0235943 A1* | 12/2003 | Trivedi | 438/197 |
| 2004/0077136 A1* | 4/2004 | Ma et al. | 438/200 |
| 2004/0108559 A1 | 6/2004 | Sugii et al. | |

FOREIGN PATENT DOCUMENTS

| | | |
|---|---|---|
| GB | 2 358 737 A | 4/2001 |
| WO | WO 00/57461 | 9/2000 |

OTHER PUBLICATIONS

Polishchuk et al., "Dual Workfunction CMOS Gate Technology Based on Metal Interdiffusion", www.eesc.berkeley.edu, 1 page, (no date).

Doug Barlage et al., "High-Frequency Response of 100nm Integrated CMOS Transistors with High-K Gate Dielectrics", 2001 IEEE, 4 pages.

Lu et al., "Dual-Metal Gate Technology for Deep-Submicron CMOS Devices", dated Apr. 29, 2003, 1 page.

Schwantes et al., "Performance Improvement of Metal Gate CMOS Technologies with Gigabit Feature Sizes", Technical University of Hanburg-Harburg, 5 pages, (no date).

* cited by examiner

US 7,176,090 B2

METHOD FOR MAKING A SEMICONDUCTOR DEVICE THAT INCLUDES A METAL GATE ELECTRODE

FIELD OF THE INVENTION

The present invention relates to methods for making semiconductor devices, in particular, semiconductor devices with metal gate electrodes.

BACKGROUND OF THE INVENTION

When making a CMOS device that includes metal gate electrodes, a replacement gate process may be used to form gate electrodes from different metals. In that process, a first polysilicon layer, bracketed by a pair of spacers, is removed to create a trench between the spacers. The trench is filled with a first metal. A second polysilicon layer is then removed, and replaced with a second metal that differs from the first metal.

In such a replacement gate process, the first and second polysilicon layers (to be replaced with metal) are etched polysilicon layers that define the gate lengths for the subsequently formed metal gate electrodes. In a particular application, it may be desirable to create metal gate electrodes with 45 nm (or shorter) gate lengths. It may not be possible, however, to form an etched polysilicon layer with a width of about 45 nm (or less) that is suitable for high volume manufacturing using conventional photolithographic techniques.

While it may be difficult to form extremely thin etched polysilicon layers, any success in doing so may raise another problem—if those patterned polysilicon layers have substantially vertical side walls. After removing such a patterned polysilicon layer, it may be difficult to uniformly coat the sidewalls of the resulting trench with various materials. In addition, it may not be possible to completely fill such a trench with metal, as voids may form at the trench center.

Accordingly, there is a need for an improved method for making a semiconductor device that includes metal gate electrodes. There is a need for a method for generating a patterned sacrificial structure that enables a gate length of 45 nm (or less), while having a profile that facilitates metal gate electrode formation. The present invention provides such a method.

Figure 1A:
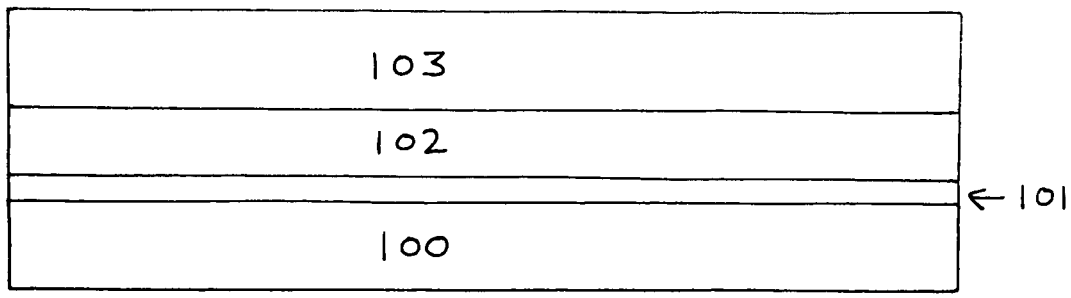
FIGS. 1a–1l represent cross-sections of structures that may be formed when carrying out an embodiment of the method of the present invention.

Features shown in these figures are not intended to be drawn to scale.

DETAILED DESCRIPTION OF THE PRESENT INVENTION

A method for making a semiconductor device is described. That method comprises forming a dielectric layer on a substrate, then forming on the dielectric layer a sacrificial structure that comprises a first layer and a second layer such that the second layer is wider than the first layer. After removing the sacrificial structure to generate a trench, a metal gate electrode is formed within the trench.

In the following description, a number of details are set forth to provide a thorough understanding of the present invention. It will be apparent to those skilled in the art, however, that the invention may be practiced in many ways other than those expressly described here. The invention is thus not limited by the specific details disclosed below.

FIGS. 1a–1l represent cross-sections of structures that may be formed, when carrying out an embodiment of the method of the present invention. Initially, first dielectric layer 101 is formed on substrate 100, first layer 102 is formed on first dielectric layer 101, and second layer 103 is formed on first layer 102, generating the FIG. 1a structure. Substrate 100 may comprise any material that may serve as a foundation upon which a semiconductor device may be built. First dielectric layer 101 may comprise silicon dioxide, a nitrided silicon dioxide, a high-k dielectric layer, or other materials that may protect substrate 100.

In this embodiment, first layer 102 may comprise a material that may be removed using an appropriate wet etch process. First layer 102 may, for example, comprise silicon, a silicon containing alloy, germanium, or a germanium containing alloy. First layer 102 preferably is between about 100 and about 500 angstroms thick. Second layer 103, like first layer 102, may comprise, for example, silicon, a silicon containing alloy, germanium, or a germanium containing alloy. Second layer 103 preferably is between about 400 and about 800 angstroms thick. First dielectric layer 101, first layer 102, and second layer 103 may be formed using conventional process steps, as will be apparent to those skilled in the art.

In this embodiment, first layer 102 must comprise a material that may be removed selectively. If, for example, first layer 102 comprises germanium, then second layer 103 should comprise silicon or another material that may be removed at a slower rate than first layer 102 may be removed, when subjected to an appropriate etch chemistry. Similarly, if first layer 102 comprises silicon, then second layer 103 should comprise germanium or another material that may be removed at a slower rate than first layer 102 may be removed. Although a few examples of materials from which first and second layers 102 and 103 may be formed are identified here, many other materials that enable first layer 102 to be removed selectively to second layer 103 may be used instead without departing from the spirit and scope of the present invention.

Figure 1B:
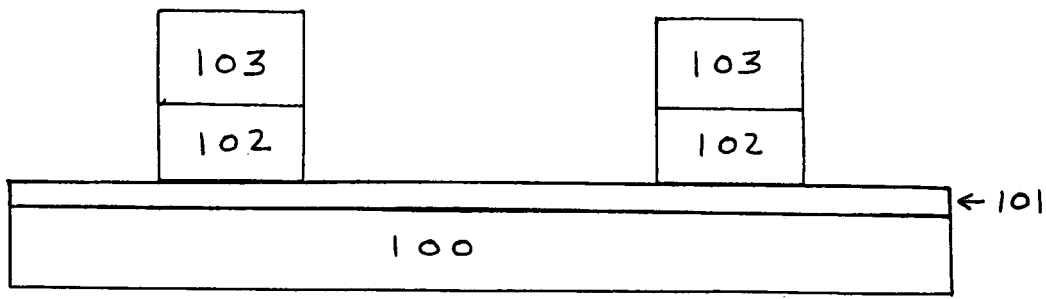

After forming the FIG. 1a structure, first layer 102 and second layer 103 may be patterned using conventional lithography and dry etch processes to generate the FIG. 1b structure. In a preferred embodiment, at this stage in the process first layer 102 and second layer 103 should each be less than about 1,000 angstroms wide, and should preferably be between about 400 and about 600 angstroms wide.

After forming the FIG. 1b structure, sacrificial structures 104 and 114 are formed by exposing first layer 102 and second layer 103 to an aqueous solution that removes substantially more of first layer 102 than second layer 103. As a result, second layer 103 is wider than first layer 102. If first layer 102 comprises germanium and second layer 103 comprises silicon, then sacrificial structures 104 and 114 may be formed by exposing layers 102 and 103 to an aqueous solution that comprises hydrogen peroxide. In a preferred embodiment, such an aqueous solution comprises between about 2 percent and about 5 percent of hydrogen peroxide by volume. Such a solution may further include between about 1 percent and about 10 percent of ammonium hydroxide by volume.

If first layer 102 comprises silicon and second layer 103 comprises germanium, then sacrificial structures 104 and 114 may be formed by exposing layers 102 and 103 to an aqueous solution that comprises a source of hydroxide, e.g., ammonium hydroxide or tetramethyl ammonium hydroxide ("TMAH"). In a preferred embodiment, such an aqueous solution comprises between about 2 percent and about 15 percent of ammonium hydroxide or TMAH by volume. Portions of first layer 102 may be removed until first layer 102 has a width that is at least about 100 angstroms smaller than the width of second layer 103. In a particularly preferred embodiment, first layer 102 has a width that is less than about 300 angstroms after portions of that layer are removed. After forming sacrificial structures 104 and 114, the uncovered part of first dielectric layer 101 may be removed, e.g., via a conventional etch process, to generate the FIG. 1c structure.

As demonstrated below, applying the method of the present invention to form a sacrificial structure that comprises a second sacrificial layer that is wider than an underlying first sacrificial layer may enable one to use a replacement gate process to form very small transistors that include metal gate electrodes. FIGS. 1d–1l illustrate structures that may be formed, when integrating the method of the present invention into such a process.

Figure 1C:
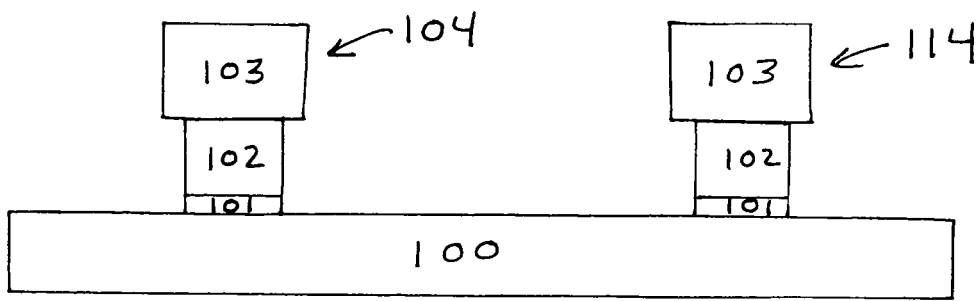
Figure 1D:
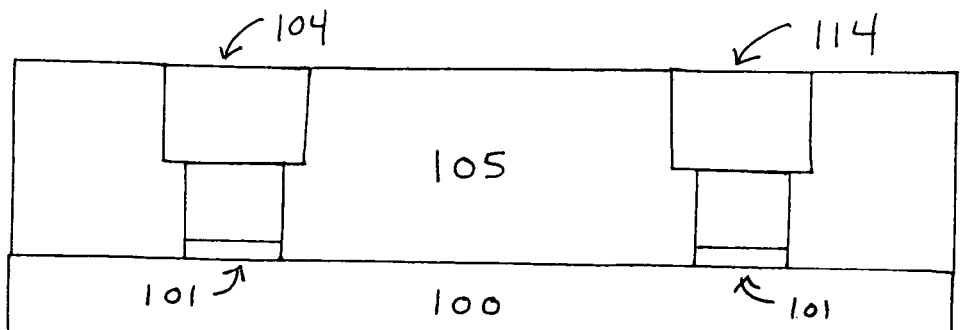

After forming the FIG. 1c structure, second dielectric layer 105 may be deposited over the device, generating the FIG. 1d structure. Second dielectric layer 105 may comprise, for example, silicon dioxide or a low-k material. By this stage of the process, source and drain regions have already been formed. Conventional process steps, materials, and equipment may be used to generate such structures, as will be apparent to those skilled in the art. In this regard, a conventional chemical mechanical polishing ("CMP") operation may be applied to remove any part of second dielectric layer 105 that was formed on sacrificial structures 104 and 114, when initially deposited.

Figure 1E:
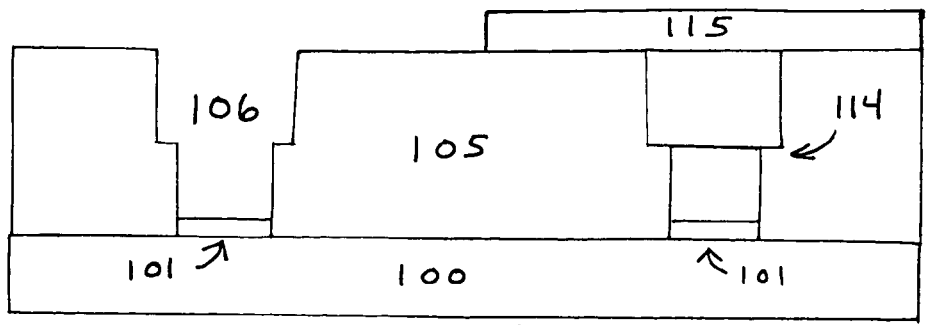
Figure 1F:
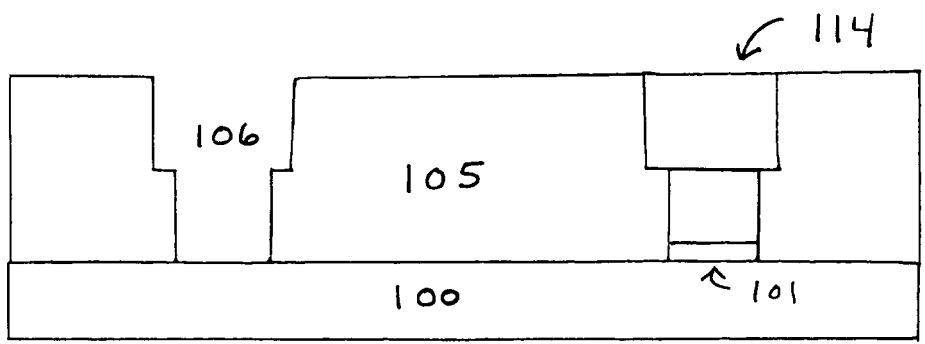

After forming the FIG. 1d structure, sacrificial structure 104 is removed to generate trench 106 that is nested within second dielectric layer 105—producing the structure of FIG. 1e. In a preferred embodiment, a wet etch process is applied to remove sacrificial structure 104. Such a wet etch process may comprise exposing sacrificial structure 104 to an appropriate aqueous solution, or solutions, for a sufficient time at a sufficient temperature to remove substantially all of sacrificial structure 104.

If, for example, first layer 102 comprises germanium and second layer 103 comprises silicon, then a two part wet etch process may be used to remove sacrificial structure 104. To remove the upper silicon layer, that layer may be exposed to an aqueous solution that comprises between about 2 percent and about 15 percent of ammonium hydroxide or TMAH by volume. After removing that upper layer, to remove the lower germanium layer, that layer may be exposed to an aqueous solution that comprises between about 2 percent and about 5 percent of hydrogen peroxide by volume and between about 1 percent and about 10 percent of ammonium hydroxide by volume.

If, instead, first layer 102 comprises silicon and second layer 103 comprises germanium, then sacrificial structure 104 may be removed using these same two wet etch steps, but in the reverse order. To remove the upper germanium layer, that layer may be exposed to an aqueous solution that comprises between about 2 percent and about 5 percent of hydrogen peroxide by volume and between about 1 percent and about 10 percent of ammonium hydroxide by volume. After removing that upper layer, to remove the lower silicon layer, that layer may be exposed to an aqueous solution that comprises between about 2 percent and about 15 percent of ammonium hydroxide or TMAH by volume. When sacrificial structure 104 is removed, it may be necessary to retain first dielectric layer 101 to protect underlying substrate 100.

As illustrated in FIG. 1e, mask 115 is formed on sacrificial structure 114, prior to removing sacrificial structure 104, to prevent removal of sacrificial structure 114, when sacrificial structure 104 is removed. Mask 115 may be formed using conventional processes and masking materials. After sacrificial structure 104 has been removed, mask 115 may be removed.

When sacrificial structure 104 is removed to form trench 106, the resulting trench is wider at the top than at the bottom because second layer 103 of sacrificial structure 104 was wider than underlying first layer 102. The sides of such a trench may be more uniformly coated than the sides of a trench that is as wide at the bottom as at the top. In addition, it may be easier to fill such a trench with metal, without void formation at the trench center, than to fill a trench that is as wide at the bottom as at the top.

In this embodiment, after removing sacrificial structure 104, the underlying part of first dielectric layer 101 is removed. When first dielectric layer 101 comprises silicon dioxide, it may be removed using an etch process that is selective for silicon dioxide to generate the FIG. 1f structure. Such an etch process may comprise exposing layer 101 to a solution that includes about 1 percent HF in deionized water. Layer 101 should be exposed for a limited time, e.g., less than about 60 seconds, as the etch process for removing first dielectric layer 101 may also remove part of second dielectric layer 105.

Figure 1G:
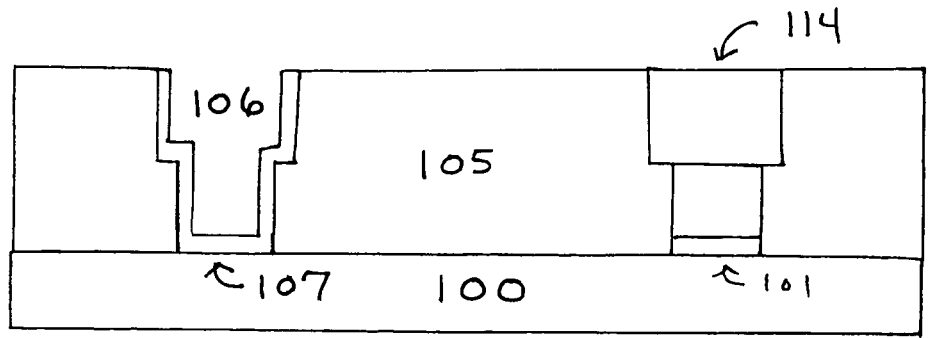

After removing first dielectric layer 101, in this embodiment high-k gate dielectric layer 107 is formed on substrate 100 within trench 106, generating the FIG. 1g structure. Some of the materials that may be used to make high-k gate dielectric layer 107 include: hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, and aluminum oxide. Although a few examples of materials that may be used to form high-k gate dielectric layer 107 are described here, that layer may be made from other materials.

High-k gate dielectric layer 107 may be formed on substrate 100 using a conventional deposition method, e.g., a conventional chemical vapor deposition ("CVD"), low pressure CVD, or physical vapor deposition ("PVD") process. Preferably, a conventional atomic layer CVD process is used. In such a process, a metal oxide precursor (e.g., a metal chloride) and steam may be fed at selected flow rates into a CVD reactor, which is then operated at a selected temperature and pressure to generate an atomically smooth interface between substrate 100 and high-k gate dielectric layer 107. The CVD reactor should be operated long enough to form a layer with the desired thickness. In most applications, high-k gate dielectric layer 107 should be less than about 60 angstroms thick, and more preferably between about 5 angstroms and about 40 angstroms thick.

As shown in FIG. 1g, when an atomic layer CVD process is used to form high-k gate dielectric layer 107, that layer will form on the sides of trench 106 in addition to forming on the bottom of that trench. (FIG. 1g represents a structure in which any part of high-k gate dielectric layer 107 that formed on second dielectric layer 105, when initially deposited, has been removed.) If high-k gate dielectric layer 107 comprises an oxide, it may manifest oxygen vacancies at random surface sites and unacceptable impurity levels, depending upon the process used to make it. It may be desirable to remove impurities from layer 107, and to oxidize it to generate a layer with a nearly idealized metal: oxygen stoichiometry, after layer 107 is deposited.

To remove impurities from that layer and to increase that layer's oxygen content, a wet chemical treatment may be applied to high-k gate dielectric layer 107. Such a wet chemical treatment may comprise exposing high-k gate dielectric layer 107 to a solution that comprises hydrogen peroxide at a sufficient temperature for a sufficient time to remove impurities from high-k gate dielectric layer 107 and to increase the oxygen content of high-k gate dielectric layer 107. The appropriate time and temperature at which high-k gate dielectric layer 107 is exposed may depend upon the desired thickness and other properties for high-k gate dielectric layer 107.

When high-k gate dielectric layer 107 is exposed to a hydrogen peroxide based solution, an aqueous solution that contains between about 2% and about 30% hydrogen peroxide by volume may be used. That exposure step should take place at between about 15° C. and about 40° C. for at least about one minute. In a particularly preferred embodiment, high-k gate dielectric layer 107 is exposed to an aqueous solution that contains about 6.7% $H_2O_2$ by volume for about 10 minutes at a temperature of about 25° C. During that exposure step, it may be desirable to apply sonic energy at a frequency of between about 10 KHz and about 2,000 KHz, while dissipating at between about 1 and about 10 watts/cm$^2$. In a preferred embodiment, sonic energy may be applied at a frequency of about 1,000 KHz, while dissipating at about 5 watts/cm$^2$.

In some embodiments, it may be desirable to mask sacrificial structure 114 (e.g., by retaining mask 115) during such a wet chemical treatment to ensure that this process step does not significantly etch sacrificial structure 114. If sacrificial structure 114 is masked while such a wet chemical treatment is applied to high-k gate dielectric layer 107, the mask may be removed following that process step.

Although not shown in FIG. 1g, it may be desirable to form a capping layer, which is no more than about five monolayers thick, on high-k gate dielectric layer 107. Such a capping layer may be formed by sputtering one to five monolayers of silicon, or another material, onto the surface of high-k gate dielectric layer 107. The capping layer may then be oxidized, e.g., by using a plasma enhanced chemical vapor deposition process or a solution that contains an oxidizing agent, to form a capping dielectric oxide.

Figure 1H:
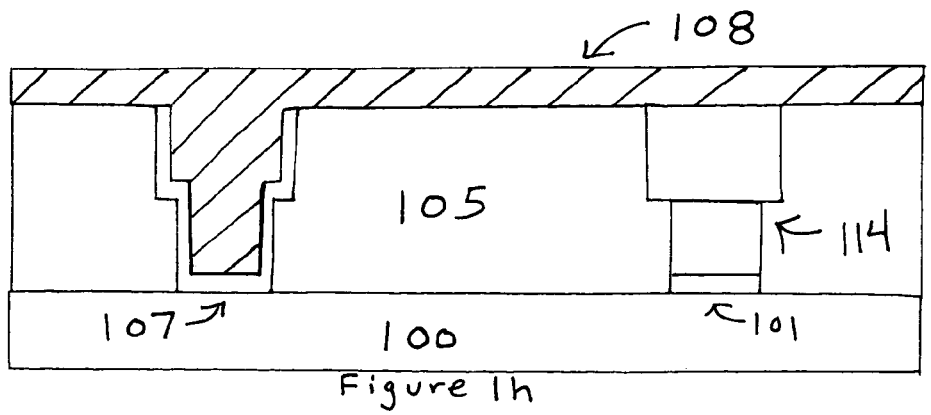

Although in some embodiments it may be desirable to form a capping layer on gate dielectric layer 107, in the illustrated embodiment, n-type metal layer 108 is formed directly on layer 107 to fill trench 106 and to generate the FIG. 1h structure. N-type metal layer 108 may comprise any n-type conductive material from which a metal NMOS gate electrode may be derived. Materials that may be used to form n-type metal layer 108 include: hafnium, zirconium, titanium, tantalum, aluminum, and their alloys, e.g., metal carbides that include these elements, i.e., hafnium carbide, zirconium carbide, titanium carbide, tantalum carbide, and aluminum carbide. N-type metal layer 108 may alternatively comprise an aluminide, e.g., an aluminide that comprises hafnium, zirconium, titanium, tantalum, or tungsten.

Figure 1I:
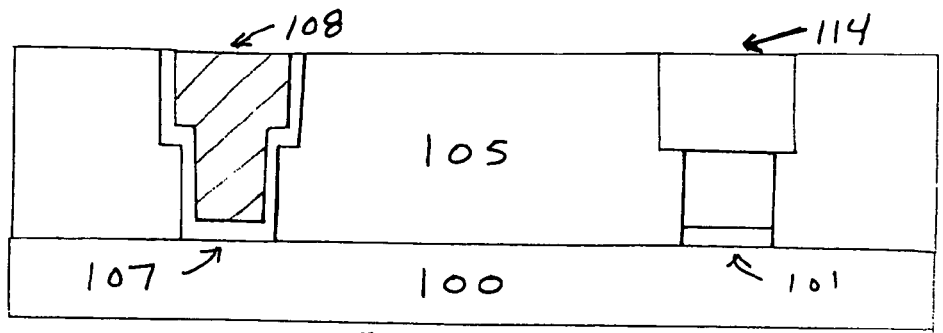

N-type metal layer 108 may be formed on high-k gate dielectric layer 107 using well known PVD or CVD processes, e.g., conventional sputter or atomic layer CVD processes. As shown in FIG. 1i, n-type metal layer 108 is removed except where it fills trench 106. Layer 108 may be removed from other portions of the device via an appropriate CMP operation. Second dielectric layer 105 may serve as a polish stop, when layer 108 is removed from its surface.

N-type metal layer 108 preferably serves as a metal NMOS gate electrode that has a workfunction that is between about 3.9 eV and about 4.2 eV. Although FIGS. 1h and 1i represent structures in which n-type metal layer 108 fills all of trench 106, in alternative embodiments, n-type metal layer 108 may fill only part of trench 106, with the remainder of the trench being filled with a material that may be easily polished, e.g., tungsten, aluminum, titanium, or titanium nitride.

Figure 1J:
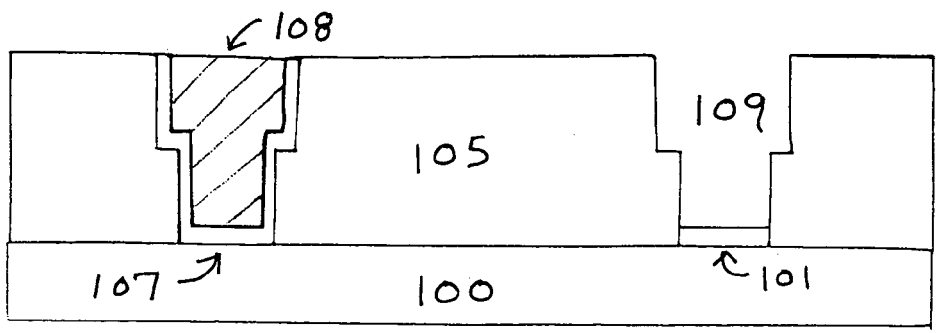

In the illustrated embodiment, after forming n-type metal layer 108 within trench 106, sacrificial structure 114 is removed to generate trench 109 that is nested within second dielectric layer 105—producing the structure of FIG. 1j. In a preferred embodiment, the same wet etch process used to remove sacrificial structure 104 may be used to remove sacrificial structure 114. In some embodiments, the materials for making sacrificial structure 114 and n-type metal layer 108, and the process for removing sacrificial structure 114, may enable sacrificial structure 114 to be removed selectively to n-type metal layer 108. If, however, sacrificial structure 114 cannot be removed selectively to n-type metal layer 108, then it may be desirable to mask n-type metal layer 108 prior to removing sacrificial structure 114.

After removing sacrificial structure 114, the underlying part of first dielectric layer 101 is removed and replaced with high-k gate dielectric layer 110, using process steps like those identified above. Optionally, as mentioned above, a capping layer (which may be oxidized after it is deposited) may be formed on high-k gate dielectric layer 110 prior to filling trench 109 with a p-type metal. In this embodiment, however, after replacing first dielectric layer 101 with high-k gate dielectric layer 110, p-type metal layer 111 is formed directly on high-k gate dielectric layer 110 to fill trench 109 and to generate the FIG. 1k structure.

P-type metal layer 111 may comprise any p-type conductive material from which a metal PMOS gate electrode may be derived. Materials that may be used to form p-type metal layer 111 include: ruthenium, palladium, platinum, cobalt, nickel, and conductive metal oxides, e.g., ruthenium oxide. P-type metal layer 111 may be formed on high-k gate dielectric layer 110 using well known PVD or CVD processes, e.g., conventional sputter or atomic layer CVD processes. As shown in FIG. 1l, p-type metal layer 111 is removed except where it fills trench 109. Layer 111 may be removed from other portions of the device via an appropriate CMP operation, with second dielectric layer 105 serving as a polish stop. P-type metal layer 111 may serve as a metal PMOS gate electrode with a workfunction that is between about 4.9 eV and about 5.2 eV.

Figure 1K:
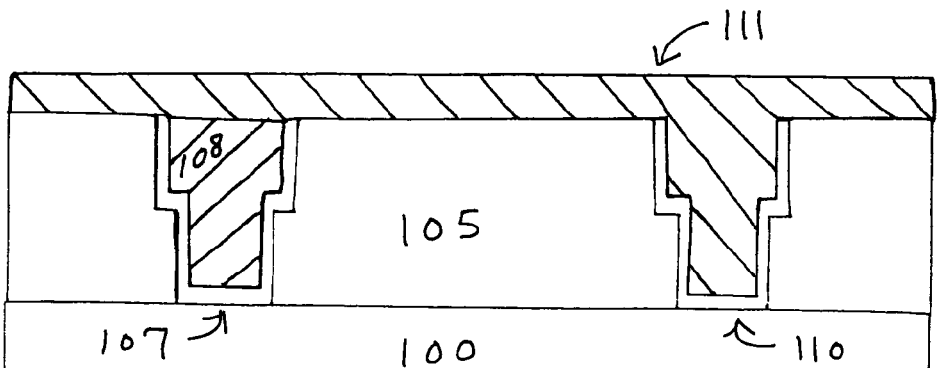
Figure 1L:
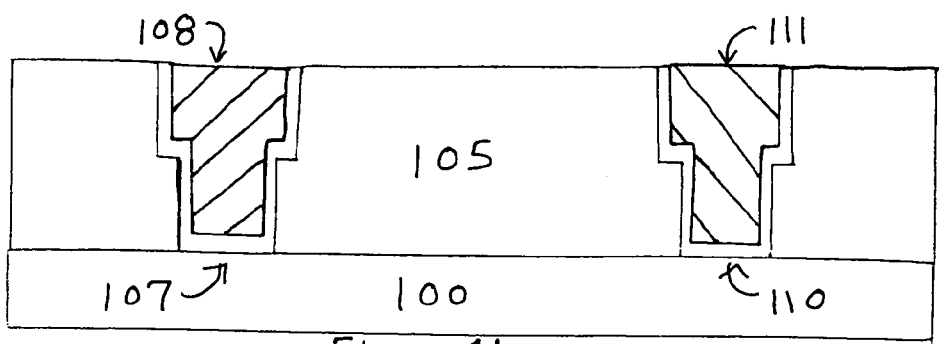

Although FIGS. 1k and 1l represent structures in which p-type metal layer 111 fills all of trench 109, in alternative embodiments, p-type metal layer 111 may fill only part of trench 109. As with the metal NMOS gate electrode, the remainder of the trench may be filled with a material that may be easily polished, e.g., tungsten, aluminum, titanium, or titanium nitride. Although a few examples of materials for forming metal layers 108 and 111 are identified here, those metal layers may be made from many other materials, as will be apparent to those skilled in the art. Although this embodiment illustrates forming a metal NMOS gate electrode prior to forming a metal PMOS gate electrode, alternative embodiments may form a metal PMOS gate electrode prior to forming a metal NMOS gate electrode.

In the illustrated embodiment, first dielectric layer 101 is replaced with a high-k gate dielectric layer after sacrificial structures 104 and 114 are removed. In an alternative embodiment, first dielectric layer 101 may comprise a high-k gate dielectric layer that is retained after sacrificial structures 104 and 114 are removed. In that alternative embodiment, metal layers 108 and 111 are formed directly on first dielectric layer 101, without first replacing first dielectric layer 101 with a high-k gate dielectric layer.

In the illustrated embodiment, mask 115 prevents sacrificial structure 114 from being removed when sacrificial structure 104 is removed. In an alternative embodiment, mask 115 is not formed on sacrificial structure 114. Instead, both sacrificial structure 104 and sacrificial structure 114 are removed at the same time, e.g., by applying an appropriate wet etch process. Following the simultaneous removal of sacrificial structures 104 and 114, NMOS and PMOS metal gate electrodes may be formed in various ways.

One way NMOS and PMOS metal gate electrodes may be formed, after simultaneously removing sacrificial structures 104 and 114, begins with forming a first metal layer in only trench 106 or trench 109. A first metal layer may be formed in only one trench by depositing a metal layer in both trenches, masking the metal layer where formed in one of the trenches, removing the exposed metal from the other trench, then removing the mask. After forming the first metal layer in only one trench, a second metal layer may be deposited in both trenches, covering the first metal layer in one of the trenches and covering the high-k gate dielectric layer in the other trench. In this alternative embodiment, the first metal layer may set the workfunction for one of the devices (i.e., NMOS or PMOS), while the second metal layer may set the workfunction for the other device.

Another way to form NMOS and PMOS metal gate electrodes, after simultaneously removing sacrificial structures 104 and 114, also begins with depositing a single metal layer in both trenches. Rather than mask and remove part of that metal layer, part (or parts) of it are modified to set the desired workfunctions for both NMOS and PMOS devices. Although the illustrated embodiments provide examples for how the method of the present invention may be used in a replacement gate process, those skilled in the art will recognize that this method may be integrated into such a process in many other ways.

After removing metal layer 111, except where it fills trench 109, a capping dielectric layer (not shown) may be deposited onto second dielectric layer 105, metal NMOS gate electrode 108, and metal PMOS gate electrode 111, using any conventional deposition process. Process steps for completing the device that follow the deposition of such a capping dielectric layer, e.g., forming the device's contacts, metal interconnect, and passivation layer, are well known to those skilled in the art and will not be described here.

The method described above may enable formation of transistors with metal gate electrodes having gate lengths that are shorter than those which conventional photolithographic techniques facilitate. In addition, the method described above may enable narrow trenches to be formed whose sides may be uniformly coated with selected materials, and that may be completely filled with metal without voids being created in their centers. Although the embodiments described above provide examples of processes for forming devices that include such trenches, the present invention is not limited to these particular embodiments.

Although the foregoing description has specified certain steps and materials that may be used in the present invention, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method for making a semiconductor device comprising:
    forming a first dielectric layer on a substrate;
    forming on the first dielectric layer a sacrificial structure that comprises a first layer and a second layer, the second layer being formed on the first layer and the second layer being wider than the first layer;
    forming a second dielectric layer on the first dielectric layer, wherein the second dielectric layer encases the sacrificial structure;
    planarizing the second dielectric layer to expose a top surface of the sacrificial layer;
    removing the sacrificial structure to generate a trench having sidewalls and a bottom that is nested within the second dielectric layer;
    forming a conformal high-k gate dielectric layer on the sidewalls and bottom of the trench; and then
    forming a tapered metal gate electrode on the high-k gate dielectric layer within the trench, wherein the tapered metal gate electrode comprises a first metal layer and a second metal layer, the second metal layer being formed on the first metal layer and the second metal layer being wider than the first metal layer.

2. The method of claim 1 further comprising:
    removing a portion of the first dielectric layer after removing the sacrificial structure.

3. The method of claim 1 wherein the first layer comprises germanium and the second layer comprises silicon.

4. The method of claim 3 wherein the sacrificial structure is formed by forming a silicon containing layer on a germanium containing layer, then exposing the silicon containing layer and the germanium containing layer to an aqueous solution that comprises hydrogen peroxide.

5. The method of claim 1 wherein the first layer comprises silicon and the second layer comprises germanium.

6. The method of claim 5 wherein the sacrificial structure is formed by forming a germanium containing layer on a silicon containing layer, then exposing the germanium containing layer and the silicon containing layer to an aqueous solution that comprises a source of hydroxide.

7. The method of claim 6 wherein the source of hydroxide comprises ammonium hydroxide or tetramethyl ammonium hydroxide.

8. The method of claim 1 wherein the first dielectric layer is a high-k gate dielectric layer.

9. A method for making a semiconductor device comprising:
    forming a first dielectric layer on a substrate;
    forming a first layer on the first dielectric layer;
    forming a second layer on the first layer;
    forming a sacrificial structure using an aqueous solution to remove portions of the first dielectric layer, the first layer, and the second layer, wherein the aqueous solution removes substantially more of the first layer and the first dielectric layer than the second layer;
    forming a second dielectric layer on the substrate;
    removing the sacrificial structure to generate a trench within the second dielectric layer;
    forming a conformal high-k gate dielectric layer on the substrate and within the trench; and then forming a tapered metal gate electrode within the trench and on the high-k gate dielectric layer, wherein the tapered metal gate electrode comprises a first metal layer and a second metal layer, the second metal layer being formed on the first metal layer and the second metal layer being wider than the first metal layer.

10. The method of claim 9 wherein the first layer comprises germanium and is between about 100 angstroms and about 500 angstroms thick, and the second layer comprises silicon and is between about 400 angstroms and about 800 angstroms thick.

11. The method of claim 10 wherein the first layer and the second layer are exposed to an aqueous solution that comprises between about 2 percent and about 5 percent of hydrogen peroxide by volume.

12. The method of claim 9 wherein the first layer comprises silicon and is between about 100 angstroms and about 500 angstroms thick, and the second layer comprises germanium and is between about 400 angstroms and about 800 angstroms thick.

13. The method of claim 12 wherein the first layer and the second layer are exposed to an aqueous solution that comprises between about 2 percent and about 15 percent of ammonium hydroxide or tetramethyl ammonium hydroxide by volume.

14. The method of claim 1, wherein the first layer has a width that is at least about 100 angstroms smaller than the width of the second layer.

15. The method of claim 9 wherein:
the first layer comprises germanium and is between about 100 angstroms and about 500 angstroms thick;
the second layer comprises silicon and is between about 400 angstroms and about 800 angstroms thick; and
the first layer has a width that is less than about 300 angstroms after portions of the first layer are removed.

16. The method of claim 15 wherein the aqueous solution comprises between about 2 percent and about 5 percent of hydrogen peroxide by volume.

17. The method of claim 9 wherein:
the first layer comprises silicon and is between about 100 angstroms and about 500 angstroms thick;
the second layer comprises germanium and is between about 400 angstroms and about 800 angstroms thick; and
the first layer has a width that is less than about 300 angstroms after portions of the first sacrificial layer are removed.

18. The method of claim 17 wherein the aqueous solution comprises between about 2 percent and about 15 percent of ammonium hydroxide or tetramethyl ammonium hydroxide by volume.

19. The method of claim 1 wherein the high-k gate dielectric layer is less than about 40 angstroms thick, and comprises a material that is selected from the group consisting of hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate.

20. The method of claim 1 wherein the tapered metal gate electrode comprises a metal that is selected from the group consisting of hafnium, zirconium, titanium, tantalum, aluminum, a metal carbide, an aluminide, ruthenium, palladium, platinum, cobalt, nickel, and a conductive metal oxide.

* * * * *